(12) United States Patent
Dunn et al.

(10) Patent No.: US 12,724,302 B2
(45) **Date of Patent: *Sep. 1, 2026**

(54) DISPLAY ASSEMBLIES INDUCING TURBULENT FLOW

(71) Applicant: Manufacturing Resources International, Inc., Alpharetta, GA (US)

(72) Inventors: William Dunn, Alpharetta, GA (US); Marcos Diaz, Alpharetta, GA (US); Mike Brown, Cumming, GA (US); Kevin O'Connor, Duluth, GA (US); Alex Moreau, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/330,240

(22) Filed: Sep. 16, 2025

(65) Prior Publication Data

US 2026/0003220 A1 Jan. 1, 2026

Related U.S. Application Data

(63) Continuation of application No. 18/222,001, filed on Jul. 14, 2023, now Pat. No. 12,443,067, which is a continuation of application No. 17/409,273, filed on Aug. 23, 2021, now Pat. No. 11,762,231.

(51) Int. Cl.

| | |
|---|---|
| ***G02F 1/1333*** | (2006.01) |
| ***G02F 1/13357*** | (2006.01) |
| ***H05K 7/20*** | (2006.01) |

(52) U.S. Cl.

CPC .. *G02F 1/133385* (2013.01); *G02F 1/133308* (2013.01); *H05K 7/202* (2013.01); *H05K 7/20972* (2013.01); *G02F 1/133603* (2013.01)

(58) Field of Classification Search

None

See application file for complete search history.

(56) References Cited

U.S. PATENT DOCUMENTS

| | | | | |
|---|---|---|---|---|
| 12,443,067 | B2 * | 10/2025 | Dunn | H05K 7/202 |
| 2013/0279154 | A1 * | 10/2013 | Dunn | F21V 29/67 362/97.3 |
| 2022/0132699 | A1 * | 4/2022 | Sakano | F24F 5/0035 |

* cited by examiner

*Primary Examiner* — Richard H Kim

(74) *Attorney, Agent, or Firm* — Standley Law Group LLP; Jeffrey S. Standley; Adam J. Smith

(57) ABSTRACT

Display assemblies are provided which include subassemblies, including a passageway and at least one of which also includes an electronic display. A closed loop airflow pathway for circulating gas includes a rear airflow passageway between the subassemblies and the airflow passageway thereof. Fan units are located within the rear airflow passageway adjacent to an entrance to the airflow passageway of an associated one of the subassemblies. Each fan unit including fan(s) and a ducted passageway extending about an exit of fan(s) to the airflow passageway of the associated subassembly such that, when the fan is activated, the ducted passageway captures airflow exiting the fan(s) and conveys it to the entrance to the airflow passageway of the associated subassembly for flow therein in a respective direction.

20 Claims, 10 Drawing Sheets

DISPLAY ASSEMBLIES INDUCING TURBULENT FLOW

CROSS-REFERENCE TO RELATED APPLICATIONS

This application is a continuation of U.S. application Ser. No. 18/222,001 filed Jul. 14, 2023, which is a continuation of U.S. application Ser. No. 17/409,273 filed Aug. 23, 2021, now U.S. Pat. No. 11,762,231 issued Sep. 19, 2023, the disclosures of which are hereby incorporated by reference.

TECHNICAL FIELD

Exemplary embodiments relate generally to display assemblies configured to generate turbulent flow, such as in a chamber common to multiple displays.

BACKGROUND AND SUMMARY OF THE INVENTION

Display assemblies often generate heat, such as from solar loading, ingestion of relatively warm ambient air, and/or powering of internal components such as a backlight. This results in a need to thermally manage such display assemblies, particularly when used in outdoor applications. It is known to provide back-to-back electronic displays with a common plenum, such as is provided in U.S. Pat. No. 8,373,841 issued Feb. 12, 2013, or a common heat exchanger, such as is provided in U.S. Pat. No. 8,351,014 issued Jan. 8, 2013. As energy and/or manufacturing efficiency demands increase, what is needed are display assemblies which provide efficient thermal management and/or which are capable of being manufactured in an efficient manner.

Display assemblies which are capable of being manufactured in an efficient manner and/or which provide efficient thermal management are provided. These display assemblies may include multiple electronic display subassemblies, each comprising an electronic display layer. Each of the multiple electronic display subassemblies may be mountable to a structural framework, such as on opposing sides thereof so that the electronic display layers face in opposing directions. The subassemblies may be completely or substantially identical to reduce manufacturing complexity and/or the need to store or provide different types of subassemblies, such as for servicing or replacement.

Each of the subassemblies may be configured to provide a relatively laminar flow through one or both of a front passageway and an illumination device passageway. Each of the subassemblies may be configured to provide a relatively turbulent flow within a rear passageway common to at least two, or all, of the multiple subassemblies. Each subassembly may comprise one or more closed loop fan units positioned adjacent to an entrance to said front passageway and/or said illumination device passageway for the respective subassembly. Each of the closed loop fan units may comprise a plurality of fans within a common housing, though separate housings may be utilized. Each of the closed loop fan units may comprise an exhaust fluidly adjacent to the entrance to one or both of said front passageway and an illumination device passageway, and an intake fluidly adjacent to said rear passageway.

As each of the subassemblies may be completely or substantially identical, when positioned at opposing sides of the structural framework, the intake(s) for the closed loop fan unit(s) of a first one of the multiple subassemblies may be proximate to an exit of the front passageway and/or the illumination device passageway of a second one of the multiple subassemblies. Similarly, the intake(s) for the closed loop fan unit(s) of the second one of the multiple subassemblies may be proximate to the exit of the front passageway and/or the illumination device passageway of the first one of the multiple subassemblies. This may cause at least some of the air exiting the passageway and/or the illumination device passageway of a given one of the multiple subassemblies to be ingested by the closed loop fan unit of another of the multiple subassemblies. This may, alternatively or additionally, cause at least some of the air exiting the passageway and/or the illumination device passageway of a given one of the multiple subassemblies to travel through the rear passageway and be ingested by the closed loop fan unit of the given one of the multiple subassemblies. This arrangement may induce at least a partial cross-flow of circulating gas within the rear passageway and/or at least a partial counter flow of the circulating gas within the rear passageway when the closed loop fan unit(s) are activated, thereby resulting in relatively turbulent flow within the rear passageway, which may improve heat exchange efficiency. This may, alternatively, or additionally, permit relatively cool circulating gas exiting one of the subassemblies facing away from the sun to enter the front and/or illumination device passageways of an opposing one of the subassemblies facing the sun for added cooling.

The closed loop fan units may be configured to induce a relatively laminar flow within the front and/or illumination device passageways. This may improve extraction of solar load and/or maintain a relatively flat electronic display layer for improved optics. In exemplary embodiments, the closed loop fan units for each subassembly may be provided in a housing having a curved shape for improved airflow efficiency. For example, the housing may comprise peaks about each of the fans of a respective one of the closed loop fan units and a valley between adjacent ones of the fans. A leading edge of the housings for the closed fan units may extend at an angle such that the exhaust of the fans is not directly atop an entrance to one or both of the front passageway(s) and the illumination device passageway. The fans may each be centrifugal type fans.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations, as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
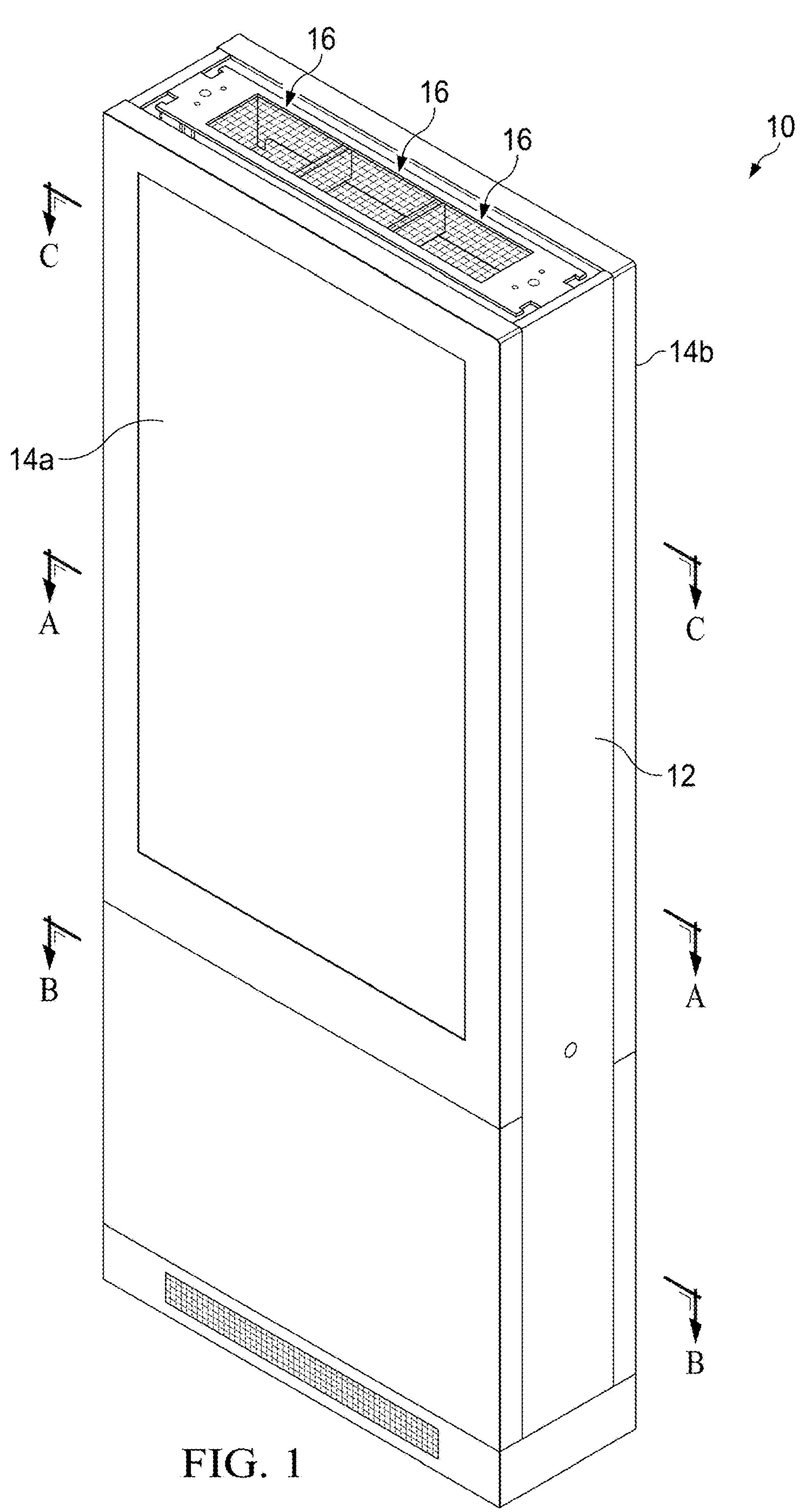
FIG. 1 is a front perspective view of an exemplary display assembly indicating section lines A-A, B-B, and C-C.

FIG. 1 is a perspective view of an exemplary electronic display assembly (hereinafter also a "unit") 10 in accordance with the present invention. The unit 10 may include a structural framework 12. The structural framework 12 may be configured for mounting to a ground surface, such as a sidewalk or street, mounting to a wall or other surface, incorporation into street furniture (e.g., phone booths, bus shelters, benches, railings, combinations thereof, or the like), combinations thereof, or the like. The structural framework 12 may comprise one or more members, panels, cladding, housings, combinations thereof, or the like.

The units 10 may comprise one or more electronic display subassemblies 14. Some or all of the electronic display subassemblies 14 may be attached to the structural framework 12 in a moveable manner, though such is not required. For example, the electronic display subassemblies 14 may be attached to the structural framework 12 in a hinged or otherwise moveable manner to permit selective movement between a closed position whereby certain parts of the units 10 are fully or partially sealed, and an open position whereby certain parts of the interior of the unit 10 are exposed for access. In exemplary embodiments, the units 10 may comprise a first and second electronic display subassemblies 14*a*, 14*b* placed on either side of the structural framework 12 such that the electronic display subassemblies 14*a*, 14*b* face in opposing directions.

One or more intakes/exhausts 16 may be provided at the units 10 for ingesting and/or exhausting ambient air.

Figure 2:
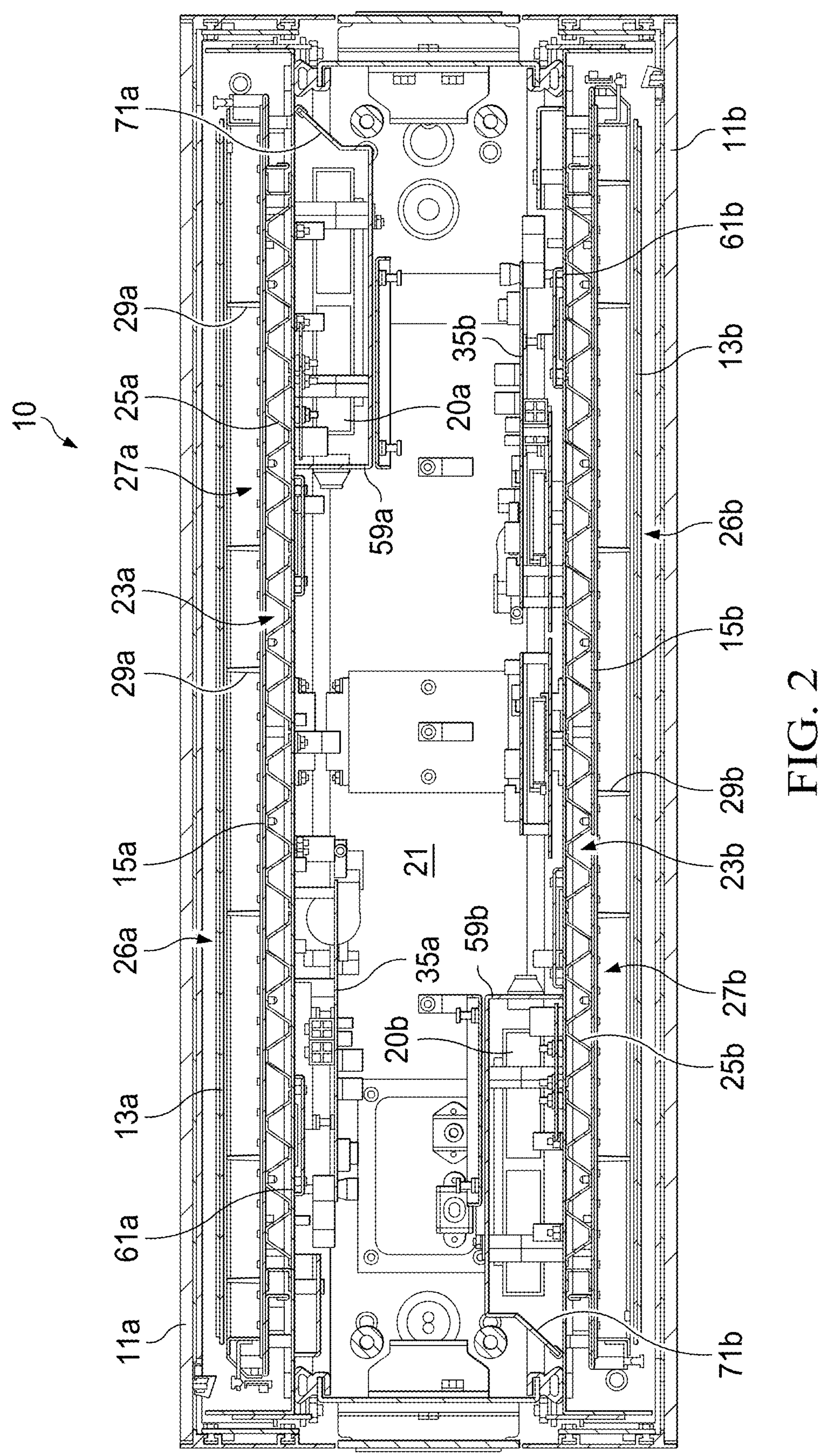
FIG. 2 is a top sectional view of an exemplary embodiment of the display assembly of FIG. 1 taken along section line A-A.
Figure 3:
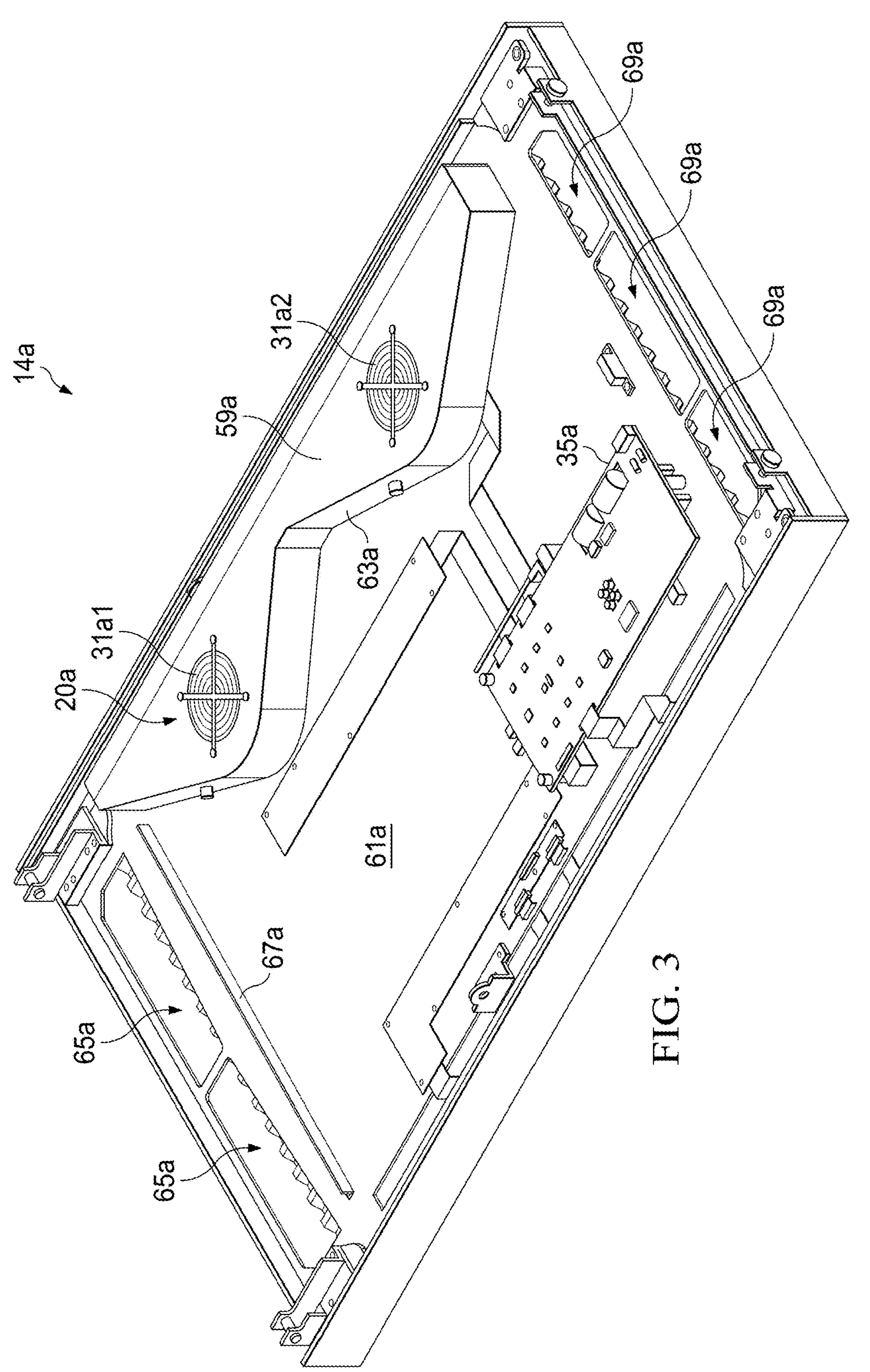
FIG. 3 is a rear perspective view of an exemplary first subassembly of the display assembly of FIG. 1 shown in isolation.
Figure 4:
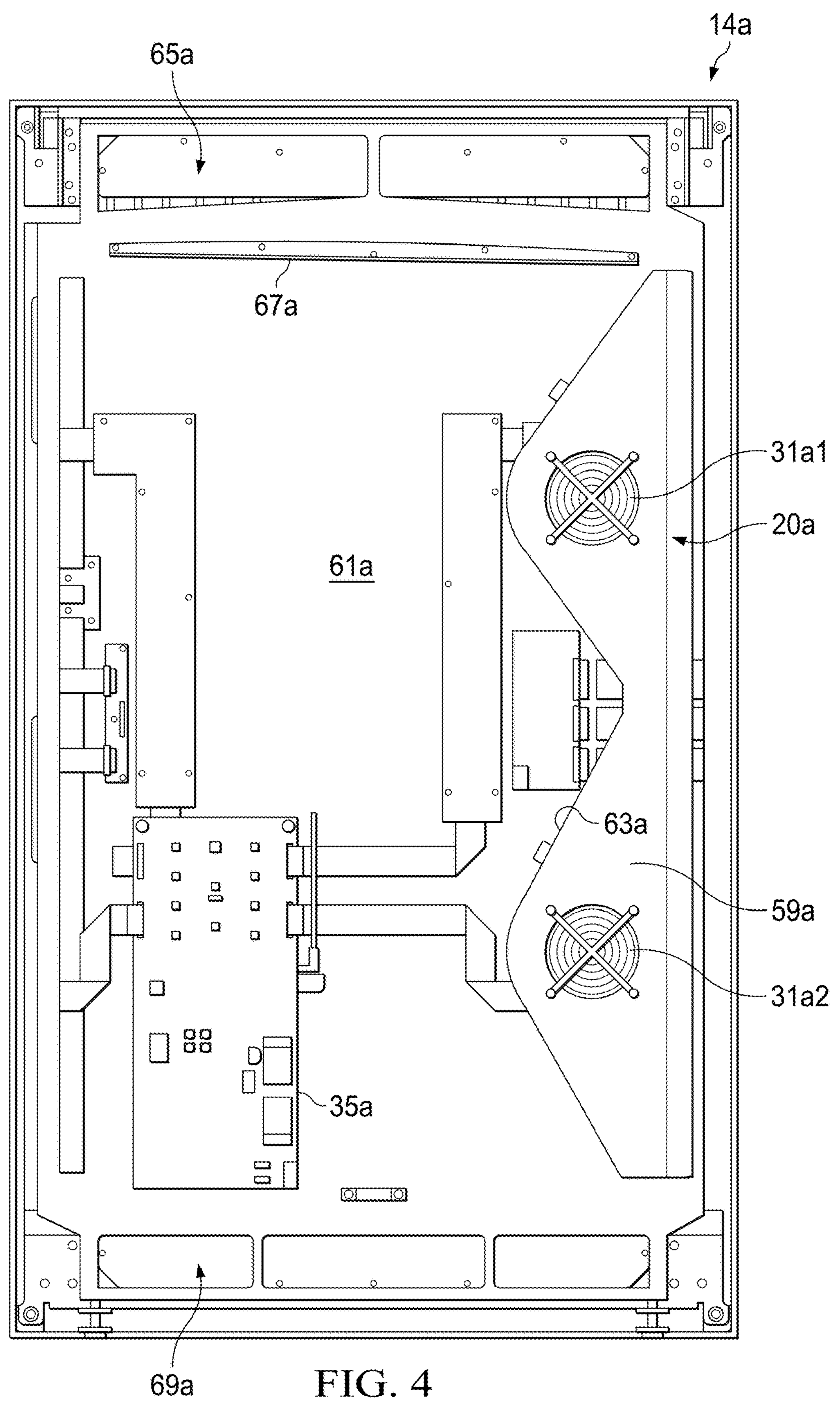
FIG. 4 is a rear view of the first subassembly of FIG. 3.

FIG. 2 through FIG. 4 illustrate exemplary internal structures of the units 10, and the various subassemblies 14. FIG. 5 through FIG. 8 illustrate exemplary airflows within the units 10, such as within the various subassemblies 14. While two electronic display subassemblies 14*a*, 14*b* placed in a back-to-back arrangement are shown, any number of electronic display subassemblies 14 may be utilized in any arrangement with the structural framework 12. Similar or the same components used in conjunction with units 10 having multiple electronic display subassemblies 14 may use the same numbering with the addition of an "a", "b" and/or "1", "2", etc. (e.g., 14 to 14*a*, 14*b*, 31*a*1 to 31*a*2). The use of a base number may refer to all such components (e.g., 14 to 14*a*, 14*b*).

Each electronic display subassembly 14 may comprise an illumination device 15. In exemplary embodiments, the illumination device 15 may comprise a number of lighting elements, such as LEDs, provided at a substrate, such as a printed circuit board. Each electronic display subassembly 14 may comprise an electronic display layer 13. The electronic display layer 13 may comprise a layer of liquid crystals, such as for a liquid crystal display, though any type or kind of electronic display may be utilized. In exemplary embodiments, the illumination device 15 may be provided rearward of the electronic display layer 13 to serve as a direct backlight. In other exemplary embodiments, the illumination device 15 may comprise one or more diffusive and/or transmissive layers and the substrate and/or lighting elements may be positioned about the edge of the electronic display layer 13 to provide edge lighting to the same. Alternatively, or additionally, one or more of the electronic display subassemblies 14 may comprise a cavity for a static poster instead of, or in addition to, to the electronic display layer 13 and/or a blank panel.

The electronic display layer 13 and/or illumination device 15 of each subassembly 14 may be positioned rearward of a cover 11. The cover 11 may comprise one or more layers of a transparent or translucent material(s). In exemplary embodiments, each cover 11 may comprise two layers bonded with an optically clear adhesive, which may provide increased impact protection. One or more polarizers, anti-reflective materials, combinations thereof, or the like may be disposed on some or all of the cover 11 as a coating, film, layer, combinations thereof, or the like. The cover 11 may form part of the electronic display subassembly 14 or may be separate therefrom. The cover 11 and the structural framework 12 may together substantially enclose the units 10, such as with intakes/exhausts 16 exempted, when the subassemblies 14 are placed in a closed position. The cover 11 may be configured to move with the electronic display subassembly 14, may be configured for independent movement, and/or may be fixed to the structural framework 12. Each of the electronic display subassemblies 14 may be connected to the structural framework 12 in a hinged or otherwise movable manner, though such is not required.

Multiple such electronic display subassemblies 14 may be provided at a given structural framework 12 for a given unit 10. For example, without limitation, two such subassemblies 14 may be mountable to opposing sides of the structural framework 12 so that the electronic display layers 13 face in opposing directions, such as in a back-to-back arrangement. The electronic display subassemblies 14 may be of the same or different type and may comprise the same or different components. The electronic display subassemblies 14 and/or electronic display layers 13 may be provided in any arrangement such as portrait or landscape.

The intakes and/or exhausts 16 may be fluidly connected to one or more open loop airflow pathways 23 within the units 10. A respective one of the open loop airflow pathways 23*a*, 23*b* may extend through a respective one of the electronic display subassemblies 14*a*, 14*b* in exemplary embodiments such that an open loop airflow pathway is provided for each one of the electronic display subassemblies 14, which may be entirely separate, or partially separated from the other open loop airflow pathways, such as for a distance and rejoined. For example, without limitation, the open loop airflow pathways 23 may extend behind and along at least a portion of the illumination devices 15 for the electronic display layers 13 for accepting flows of ambient air. Each of open loop airflow pathways 23 may comprise one or more corrugated layers 25 in exemplary embodiments. The corrugated layers 25 may improve heat transfer from the illumination device 15 to the ambient air by increasing available surface area.

One or more closed loop airflow pathways may be provided within the units 10. In exemplary embodiments, such closed loop airflow pathways may comprise at least a front passageway 26*a*, 26*b* of each of the subassemblies 14*a*, 14*b*, which may extend between the covers 11*a*, 11*b* and the electronic display layers 13*a*, 13*b* of the respective subassemblies 14*a*, 14*b*. Such closed loop airflow pathways may alternatively, or additionally, comprise at least an illumination device passageway 27*a*, 27*b* of each of the subassemblies 14*a*, 14*b*, which may extend between each of the electronic display layers 13*a*, 13*b* and the respective illumination devices 15*a*, 15*b* of the respective electronic display subassemblies 14*a*, 14*b*.

The closed loop airflow pathway may comprise a rear passageway 21, which may extend behind the electronic display subassemblies 14*a*, 14*b*, and/or the electronic display layers 13*a*, 13*b*. The rear passageway 21 may be common to at least two, or all of, the electronic display subassemblies 14 of a given unit 10. The rear passageway 21 may extend between each of the subassemblies 14. Such closed loop airflow pathways may extend entirely within the units 10, such as within outer boundaries of the structural framework 12 and/or the electronic display subassemblies 14. The rear passageway 21 may be defined, at least in part, by the structural framework 12 and/or the subassemblies 14.

Various electronic components 35*a*, 35*b* for operating the subassemblies 14*a*, 14*b*, respectively may be provided at rear panels 61*a*, 61*b* of the subassemblies 14*a*, 14*b*. The rear panels 61*a*, 61*b* may be provided rearward of the illumination devices 15*a*, 15*b* and spaced apart therefrom to at least partially define the open loop airflow pathways 23*a*, 23*b* and/or accommodate the corrugated layers 25*a*, 25*b*. In this manner, the electronic components 35*a*, 35*b* may be located within the rear passageway 21. The electronic components 35 may include, for example, without limitation, video players, power supplies, processors, electronic storage devices, controllers, sensors, combinations thereof, or the like. Any number, type, and/or kind of electronic components 35 may be utilized. The electronic components 35 may be configured to control other components of the unit 10, such as, but not limited to, open loop fan units 18. Each of the open loop fan units 18 may comprise one or more fans 18*a*, 18*b*. The electronic components 35*a*, 35*b* of a respective one of the subassemblies 14*a*, 14*b* may be configured to control components of the respective one of the subassemblies 14*a*, 14*b*, though such is not necessarily required.

One or more open loop fan units 18 may be provided. Each of the subassemblies 14 may comprise open loop intakes 65 in fluid communication with the intakes/exhausts 16 for ingesting flows of ambient air 17*a*, 17*b* into the respective open loop airflow pathways 23*a*, 23*b*. Each of the subassemblies 14 may comprise an open loop exhaust 69 in fluid communication with the intakes/exhausts 16 for ingesting ambient air 17 into the respective open loop airflow pathways 23. The same of different open loop fan units 18 may be associated with each of the open loop airflow pathways 23. The open loop fan units 18 may be configured to ingest ambient air 17 into the units 10, exhaust ambient air 17 from the assembly 10, and/or move ingested ambient air 17 through the one or more open loop airflow pathways 23 when activated. Separate open loop fan units 18 may be used for each of the multiple electronic display subassemblies 14*a*, 14*b* or the open loop fan units 18 may be common to the various electronic display subassemblies 14 of such units 10.

Each of the electronic display subassemblies 14*a*, 14*b* may comprise one or more closed loop fan units 20*a*, 20*b*. Each closed loop fan unit 20*a*, 20*b* may comprise one or more fans 31*a*1, 31*a*2, 31*b*1, 31*b*2 of a same or different type. The closed loop fan units 20 may be configured to move circulating gas through said one or more closed loop airflow pathways when activated. The closed and open loop fan units 20, 18 may comprise axial fans, centrifugal fans, combinations thereof, or the like. Any number or type of fan units 20, 18 may be used at any location in the units 10, and may be provided in banks or sets. Each of the fan units 20, 18 may be operated and/or controlled together or separately. The open loop airflow pathways may be partitioned and/or separated from the closed loop airflow pathways, though a complete (e.g., gas impermeable) separation or seal is not necessarily required. In exemplary embodiments, the separation may be sufficient to prevent solid and/or liquid particulate from passing therethrough and/or solid and/or liquid particulate above a given size from passing therethrough. For example, without limitation, such separation may be sufficient to meet certain ingress protection code (IPC) standards, such as, but not limited to, IP65, IP67, or the like. Each of the electronic display subassemblies 14*a*, 14*b* may comprise one or more partitions 67*a*, 67*b*, gaskets, walls, panels, combinations thereof, or the like, which provide separation between the ambient air 17 in the open loop airflow pathways and the circulation gas 19 in the closed loop airflow pathway(s).

Each of the closed loop fan units 20*a*, 20*b* may comprise a respective housing 59*a*, 59*b* configured to wholly or partially surround each of the individual fans 31*a*1, 31*a*2, 31*b*1, 31*b*2 of the closed loop fan units 20*a*, 20*b*. The housings 59 may be configured to accommodate all of the closed loop fans 31 of a given fan unit 20. However, in other exemplary embodiments, each individual fans 31*a*1, 31*a*2, 31*b*1, 31*b*2 or groups of the individual fans 31*a*1, 31*a*2, 31*b*1, 31*b*2 may comprise separate housings 59. The housing 59 may be configured to permit ingestion of the circulating gas 19*a/b* in the rear passageway 21 and direct the ingested circulating gas 19 in an appropriate direction, such into the front passageway 26 and/or the illumination device passageway 27 of the electronic display subassembly 14.

The housings 59 may be configured to provide a relatively laminar flow within the front passageway 26 and/or the illumination device passageway 27. The fans 31 may be positioned within the housings 59 to accomplish the same. For example, without limitation, an intake for the fans 31 may be fluidly adjacent to the rear passageway 21 and an exhaust for the fans 31 may be fluidly adjacent to the front passageway 26 and/or the illumination device passageway 27.

Each of the closed loop fan units 20*a*, 20*b* may be provided proximate to an entrance into one or both of the front passageway 26 and the illumination device passageway 27 for generating the flows 19*c*1, 19*c*2 through the front passageway 26 and the illumination device passageway 27, respectively, by pushing the circulating gas through the front passageway 26 and the illumination device passageway 27 when the fan(s) 31 are activated. An exhaust, relatively high-pressure side of the closed loop fan units 20 may be positioned fluidly adjacent to the front passageway 26 and/or the illumination device passageway 27, so that the pressure of the flows 19*c*1 and/or 19*c*2, particularly at the entrances to the front passageway 26 and the illumination device passageway 27, may be maintained at a relatively high level, such as greater than pressure of ambient air outside of the units 10, though such is not necessarily required. This may reduce or eliminate bowing of the electronic display layer 13 to improve optics. Alternatively, or additionally, this may reduce or eliminate tensile mechanical stresses on the electronic display layer 13 to reduce or eliminate cell breach.

The front passageway 26 and/or the rear passageway 27 may be configured to create and maintain a pressure differential between the flows 19*c*1 and 19*c*2 of the circulating gas 19 in the front passageway 26 and/or the rear passageway 27 sufficient to generate net forces at the electronic display layers 13 which reduces or eliminates bowing of the electronic display layers 13. In exemplary embodiments, the pressure of the flow 19*c*1 in the front passageway 26 may be maintained at a higher level than the flow 19*c*2 in the illumination device passageway 27, resulting in rearward forces against the electronic display layer 13 to reduce or eliminate outward bowing. Such pressure differentials may be generated using features including, but not limited to, those shown and/or described in U.S. Pat. No. 10,398,066 issued Aug. 27, 2019, the disclosures of which are hereby incorporated by reference as if fully restated herein.

In exemplary embodiments, positive pressure may be maintained in only the front passageway 26 and/or relatively high pressure may be maintained in the front passageway 26 (e.g., relative to pressure in the flow 19*b* in the illumination device passageway 27) such that the electronic display layer 13 is pushed towards the illumination device 15 when the closed loop fan unit 20 is operated. Optical spikes 29 or other support structures may be utilized within the illumination device passageway 27 to reduce or eliminate movement of the electronic display layer 13 towards the illumination device 15, such as past the optical spikes 29. The optical spikes 29 may comprise one or more optically transmissible materials. The optical spikes 29 may comprise rods, cones, or the like positioned within the illumination device cavity 27 and may be configured to limit or prevent rearward travel of the electronic display layer 13. The optical spikes 29 may exert normal, compressive forces on the electronic display layer 13, particularly in conjunction with the pressure of the flow 19*a* of the circulating gas within the front passageway 26. This may be particularly beneficial when unable to generate positive or sufficiently high pressure for the flow 19*c*2 of the circulating gas within the illumination device passageway 27. This may occur, for example, without limitation, due to variations in ambient air and/or circulating gas pressure. Circulating gas pressure, in particular, may vary due to temperature variations in the circulating gas (e.g., due to solar loading) and/or ambient temperatures, which may affect the unit's 10 ability to remove heat in air-to-air heat exchange.

Any number, type, kind, and/or arrangement of such optical spikes 29 may be utilized. In embodiments where more than one electronic display layer 13*a*, 13*b* is utilized, more than one set of optical spikes 29*a*, 29*b* for each respective one of the electronic display layers 13*a*, 13*b* of the same or different type may likewise be utilized, though such is not required. Such optical spikes 29 are not necessarily required, and may be omitted from view of certain embodiments provided herein to more clearly illustrate other components. However, such optical spikes 29 may be utilized in the same or similar arrangements in such embodiments, even if not expressly provided in the figures.

The housing 59 for the closed loop fan units 20 may comprise a generally curved shaped. A rear wall 63 of the housing 59 may define one or more peaks to accommodate respective ones of the fans 31 and a valley between adjacent ones of the fans 31. Each closed loop fan unit 20 may comprise any number of fans 31, and/or multiple closed loop fan units 20 and/or housings 59 may be used with each side assembly 14. Because the closed loop fans 31, particularly when provided as centrifugal fans, may be configured to exhaust fluid in a generally pinwheel pattern (e.g., outward from a center), the curved shape of the rear wall 63 may encourage relatively laminar flow into the front passageway 26 and/or illumination device passageway 27. The fans 31 may be spaced from the entrance to the front passageway 26 and/or illumination device passageway 27 and a leading edge 71*a*, 71*b* of the housings 59*a*, 59*b* may extend at an angle to encourage flow into the front passageway 26 and/or illumination device passageway 27. The rear wall 63 may define a generally sinusoidal shape curve by way of non-limiting example. Alternatively, or additionally, the rear wall 63 may define a generally wave or boomerang shape. The shape of the rear wall 63 need not be perfectly curved or smooth and may include one or more portions of which are planar.

Figure 5:
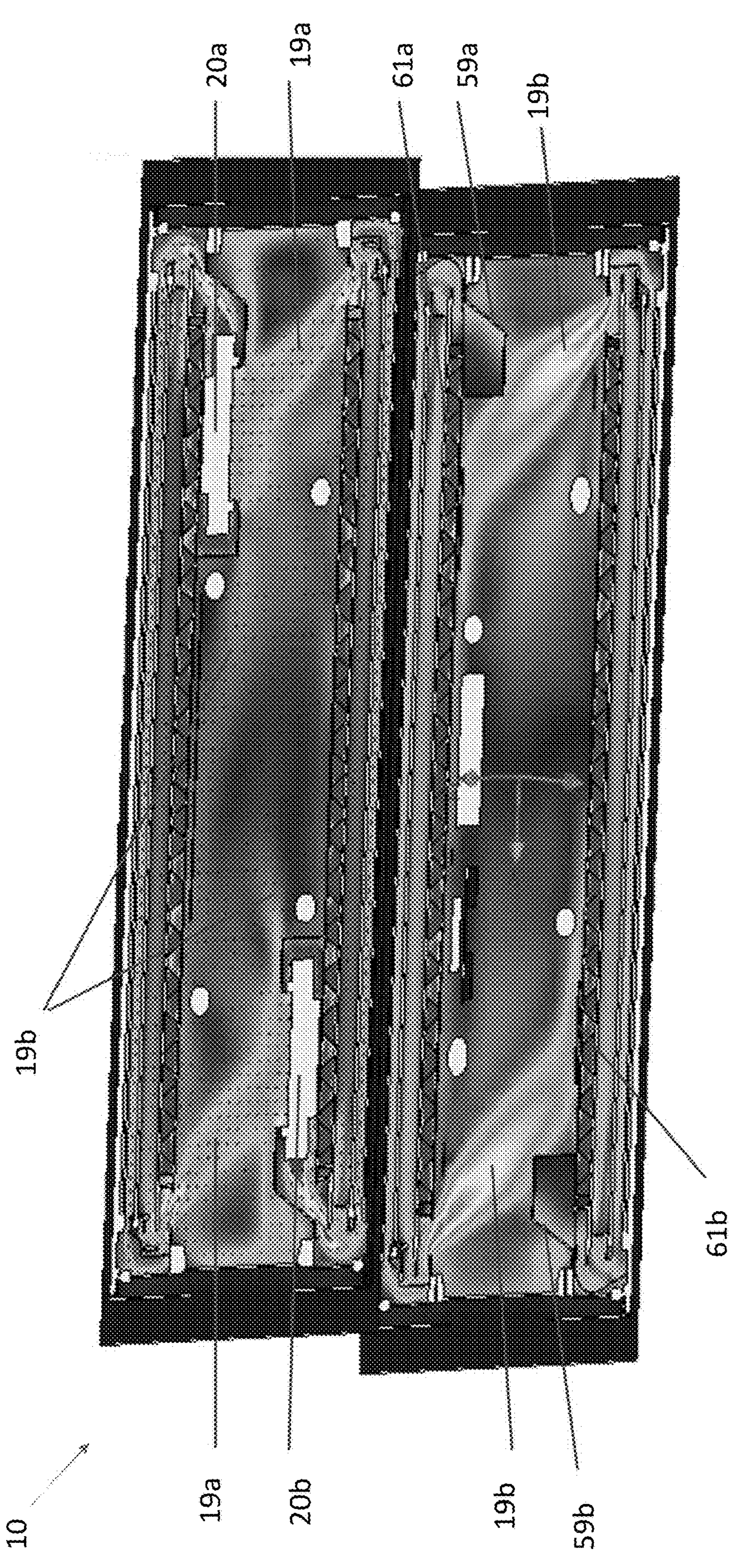
FIG. 5 is a top perspective sectional view of exemplary fluid velocities for the display assembly of FIG. 1 taken along section line C-C (upper layer) and section line B-B (lower layer) when operated under exemplary conditions.
Figure 5A:
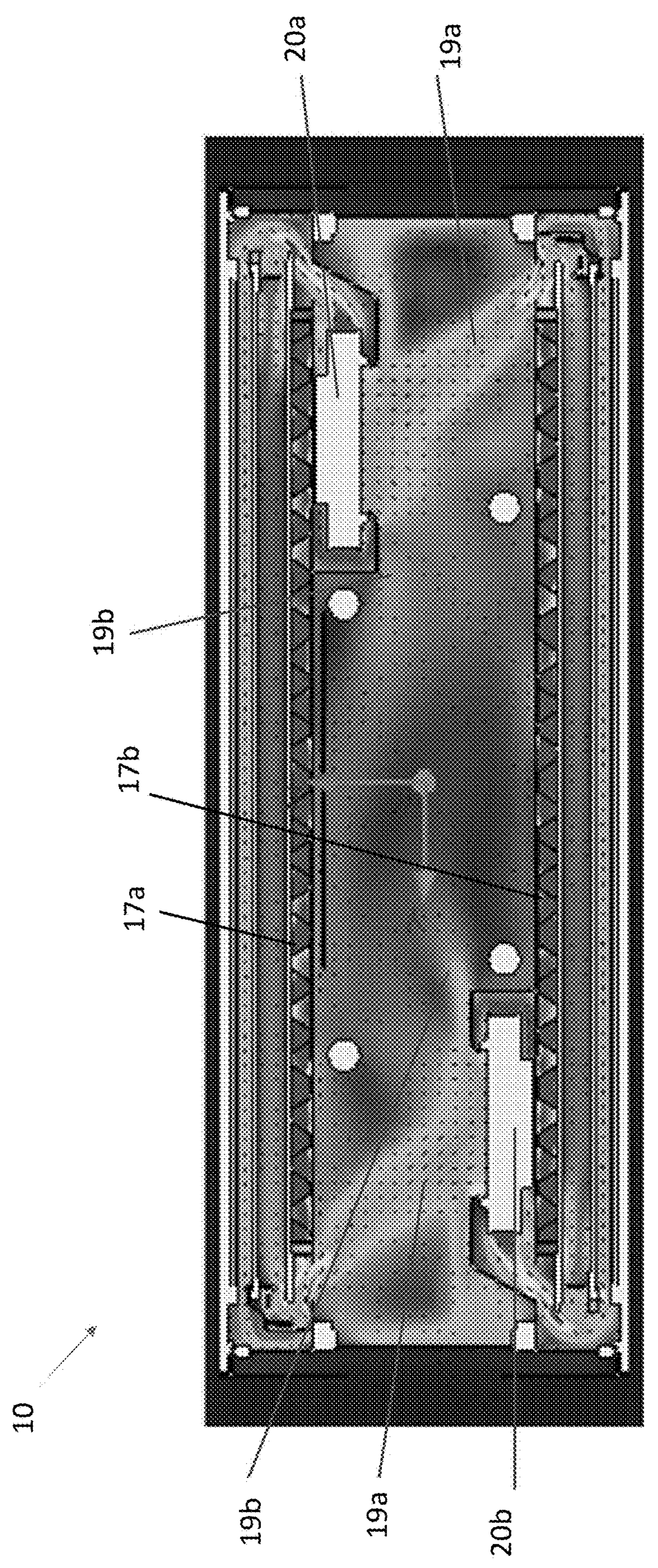
FIG. 5A is a top sectional view of the fluid velocities for the display assembly of FIG. 1 taken along section line C-C (upper layer) of FIG. 5.

When positioned on opposing sides of the structural framework 12, the closed loop fan units 20*a*, 20*b* may be located on opposing sides of the unit 10 from one another. This may be particularly true where the electronic display subassemblies 14*a*, 14*b* are the same, or substantially the same. This arrangement may permit at least a first portion 19*a* of the circulating gas exiting the front passageways 26 and/or illumination device passageways 27 to cross over from one of the electronic display subassemblies 14*a*, 14*b* to the other. This may occur more often where the exiting portion 19*a* of the circulating gas generally aligns with an intake for the opposing closed loop fan unit 20, as shown, for example, without limitation, in FIG. 5A. This may create a generally looping, continuous flow of the circulating gas 19 about both electronic display subassemblies 14. In such cases, at least a portion of the circulating gas 19 may traverse, rather than extend through, the rear passageway 21. This may be particularly helpful where one of the electronic display subassemblies 14*a* is not (or is less directly) exposed to the sun, thereby maintaining the circulating gas 19*c*1 in the front passageway 26*a* relatively cool, which may be immediately ingested to the front passageway 26*b* of the opposing one of the subassemblies 14*b*, which is (or is more directly) exposed to the sun, thereby removing heat generated by solar loading.

Some of the portion of the circulating gas 19 exiting the front passageways 26 and/or illumination device passageways 27 may not be ingested by the opposing closed loop fan unit 20 and may instead be reflected by various components, such as the rear panel 61, of the opposing subassembly 14 and cause generally chaotic or turbulent flow within the rear passageway 21.

A second portion 19*b* of the circulating gas exiting the front passageways 26*a* and/or illumination device passageways 27*a* may be attracted back to the closed loop fan 20*a* of the respective electronic display subassembly 14*a* from which it exited the front passageways 26*a* and/or illumination device passageways 27*a* such that the circulating gas forms a loop about one of the electronic display layers 13*a*. This may be true of the other electronic display subassembly or subassemblies 14*b* of a given unit 10. This may create a generally counterflow within the rear passageway 21. In this manner, at least a portion of the circulating gas 19 may extend through the rear passageway. This may improve heat transfer.

The intersection of the second portions 19*b* of the circulating gas from the multiple subassemblies 14 may generate turbulent flow within the rear passageway 21. Furthermore, some of the second portion 19*b* may be reflected off the opposing electronic display subassembly 14, such as the housing 59 and/or rear panel 17, thereby increasing the turbulence. This may improve heat transfer by itself. It may also ensure adequate mixing between the first and second portions of the circulating gas 19*a*, 19*b* for relatively even thermal management.

Figure 5B:
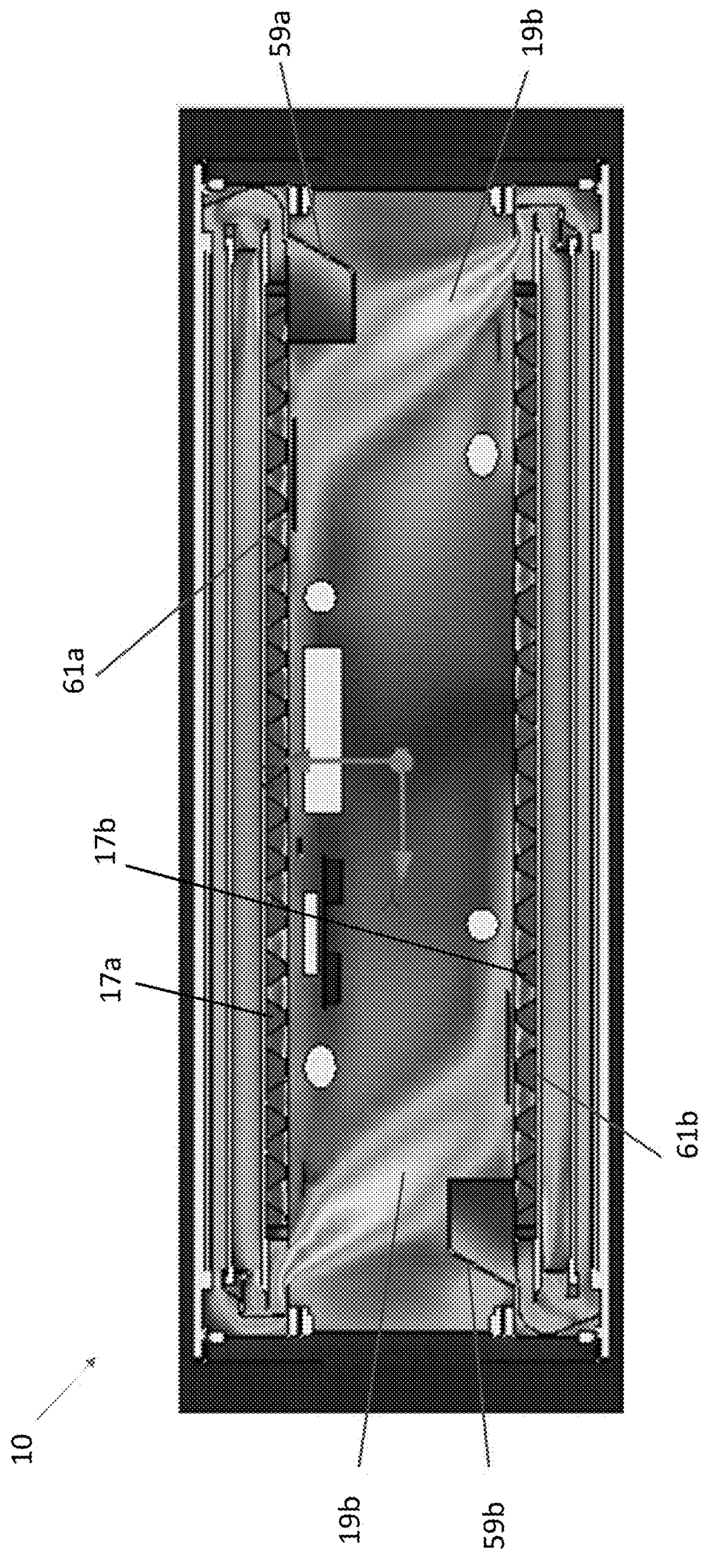
FIG. 5B is a top sectional view of the fluid velocities for the display assembly of FIG. 1 taken along section line B-B (lower layer) of FIG. 5.
Figure 6B:
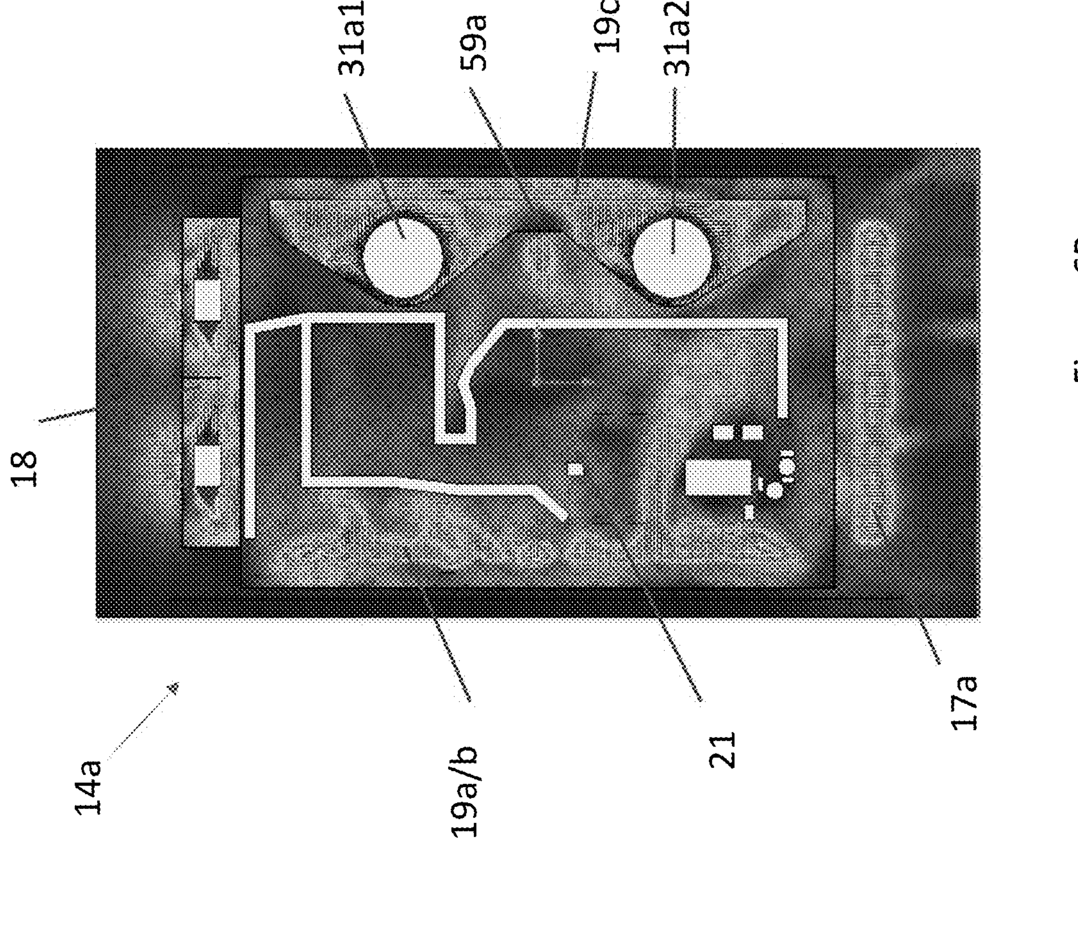
FIG. 6B is a front sectional view of exemplary fluid velocities for ambient air and circulating gas within another portion of the rear passageway of the display assembly of FIG. 1.
Figure 6A:
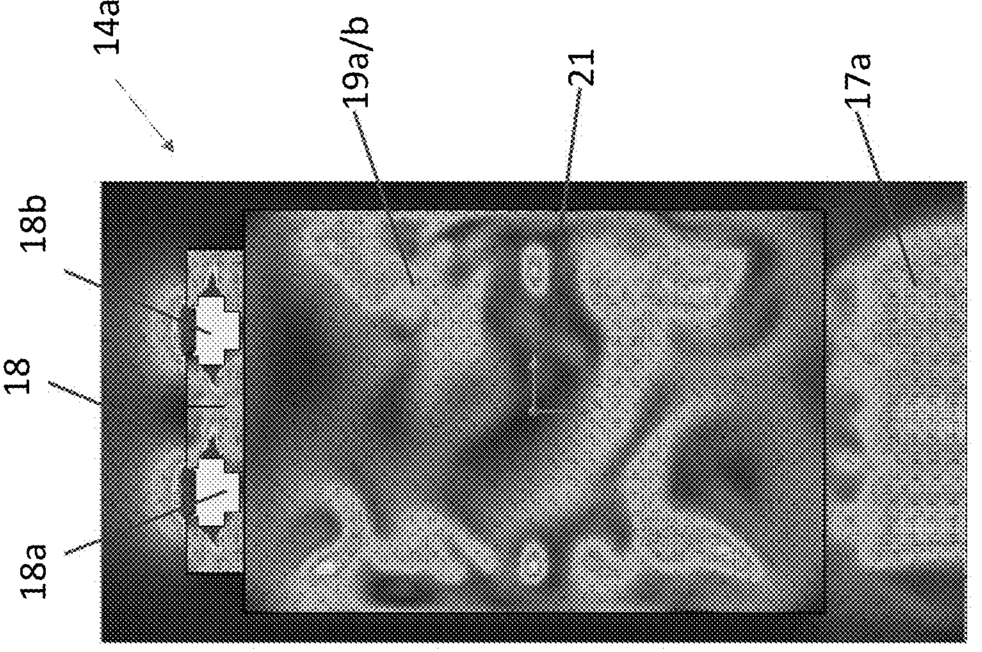
FIG. 6A is a front sectional view of exemplary fluid velocities for ambient air and circulating gas within a rear passageway of the display assembly of FIG. 1.
Figures 7A, 7B:
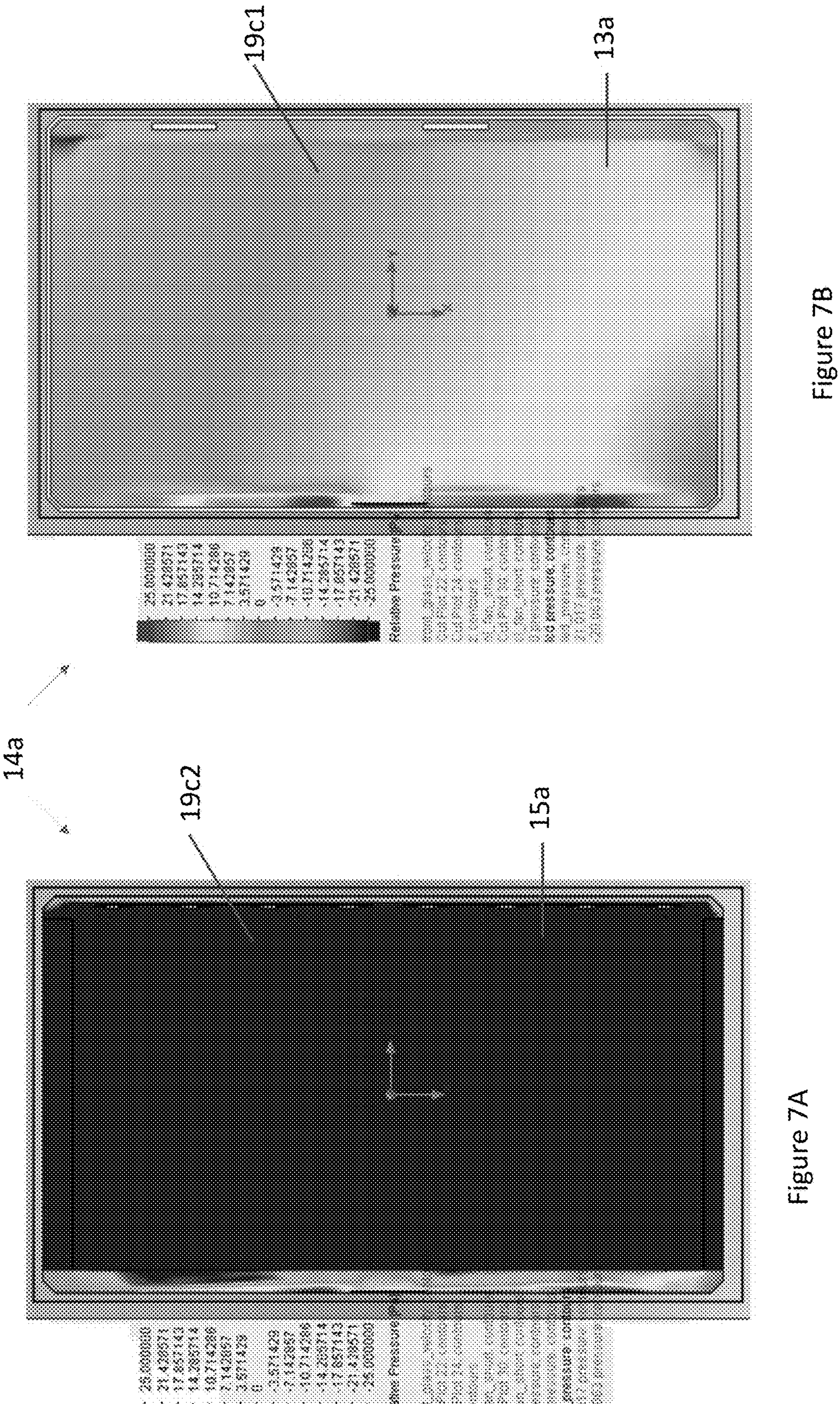
FIG. 7A is a front sectional view of exemplary fluid pressures for circulating gas within the illumination device passageway of the display assembly of FIG. 1.
FIG. 7B is a front sectional view of exemplary fluid pressures for circulating gas within the front passageway of the display assembly of FIG. 1.
Figure 8:
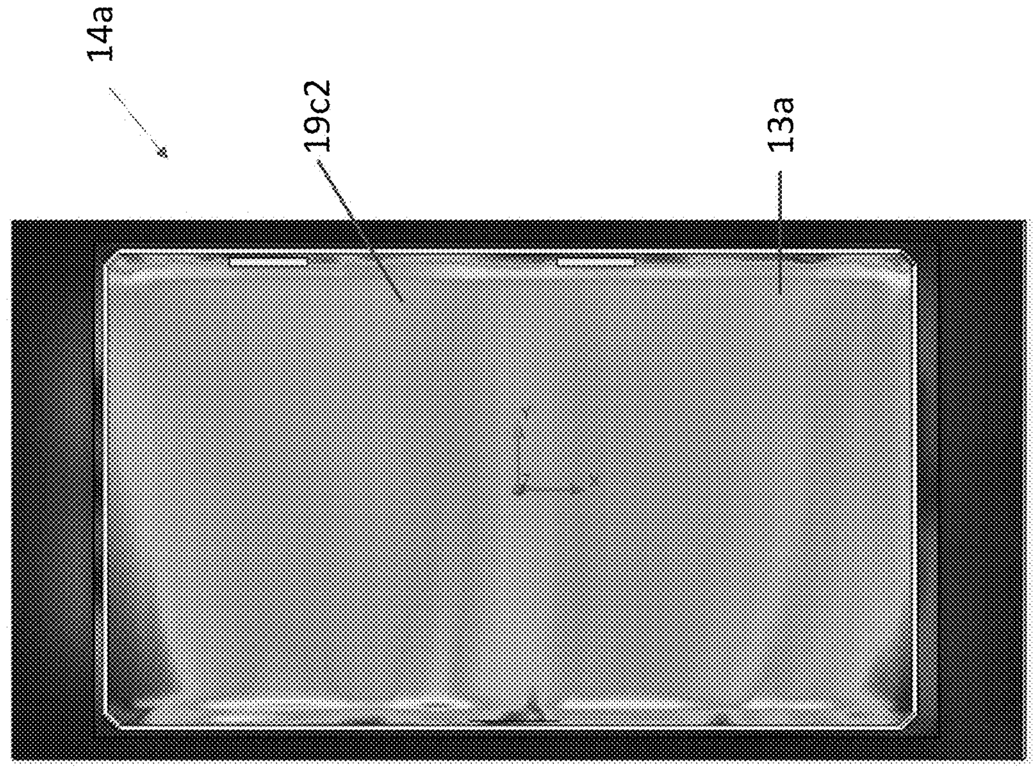
FIG. 8 is a front sectional view of exemplary fluid velocities for circulating gas within the front passageway of the display assembly of FIG. 1.

Portions of an exit from the front passageway 26 and/or illumination device passageway 27 may not generally align with intakes for fans 31 of opposing closed loop fan units 20, such as shown, for example, without limitation, in FIG. 5B. Instead, such portion of the exit from the front passageway 26 and/or illumination device passageway 27 may generally align with spaces between fans 31 of the opposing closed loop fan unit 20. This may result in a greater portion of the circulating gas 19*c* being directed through the rear passageway 21, rather than being ingested into the opposing one of the closed loop fan units 20, at least at these such locations, thereby increasing turbulence within the rear passageway 21. This may be facilitated, at least in part, by the spaced arrangement of the closed loop fans 31*a*1, 31*a*2, 31*b*1, 31*b*2 in a given closed loop fan unit 20*a*, 20*b*. The curved rear wall 63 of the housing 59 may facilitate this design by causing such existing circulating gas 19*c* to impact the rear panels 61 and be reflected or otherwise scattered therefrom.

As demonstrated by the various pressure and velocity plots of FIGS. 5-8, which are provided as non-limiting examples, this may induce relatively laminar flows within the front passageway 26 and/or illumination device passageway 27 and relatively turbulent flow within the rear passageway 21. The relatively laminar flows may provide consistent thermal management and improved optics while the relatively turbulent flows may improve heat transfer.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may comprise personal computers, smartphones, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly comprising:

a first and second subassembly, each comprising an airflow passageway having an entrance and an exit and each being oriented such that the entrance of the airflow passageway of the first subassembly is located proximate to the exit of the airflow passageway of the second subassembly relative to the entrance to the airflow passageway of the second subassembly, and wherein at least one of the first and second subassembly comprises an electronic display;

a closed airflow pathway for circulating gas comprising a rear airflow passageway between said first and second subassemblies and said airflow passageway of each of said first and second subassemblies; and fan units, each located within the rear airflow passageway adjacent to the entrance to the airflow passageway of an associated one of the first and second subassemblies, each of said fan units comprising at least one fan and a ducted passageway extending about an exit of the at least one fan and to the airflow passageway of the associated subassembly such that, when the at least one fan is activated, the ducted passageway captures airflow of the circulating gas exiting the at least one fan and conveys it to the entrance to the airflow passageway of the associated one of the first and second subassemblies to the exclusion of the airflow passageway of a non-associated one of the first and second subassembly for flow therein in a respective direction such that the airflow of the circulating gas through the airflow passageway of the first and second subassembly are provided in different directions from one another.

2. The display assembly of claim 1 further comprising:

a structural framework, wherein said first and second subassembly are attached to said structural framework.

3. The display assembly of claim 2 wherein:

the first and second subassemblies are attached to opposing sides of the structural framework.

4. The display assembly of claim 3 wherein:

each of said first and second subassemblies are secured to said structural framework in a moveable manner such that the first and second subassemblies are moveable between a closed position where the first and second subassemblies extend adjacent to the structural framework and an opened position where at least the portion of the first and second subassemblies is moved away from the structural framework.

5. The display assembly of claim 1 wherein:

the first subassembly comprises the electronic display; and the second subassembly comprises a second electronic display.

6. The display assembly of claim 5 wherein:

the electronic display and the second electronic display each comprise:

an electronic display layer;

an illumination device for providing illumination to said electronic display layer when powered; and a cover positioned forward of said electronic display layer.

7. The display assembly of claim 6 wherein:

said electronic display layer of each of the electronic display and the second electronic display comprises liquid crystals.

8. The display assembly of claim 7 wherein:

said illumination device of each of the electronic display and the second electronic display comprises light-emitting diodes arranged to directly illuminate the electronic display layer of the respective electronic display when activated.

9. The display assembly of claim 1 further comprising:

an intake fluidly connected to an ambient environment;

an exhaust fluidly connected to the ambient environment;

an additional airflow passageway provided at each of the first and second subassemblies and fluidly connected to the intake and the exhaust;

an open airflow pathway comprising the intake, the exhaust, and the additional airflow passageway of each of the first and second subassemblies; and one or more fans located along the open airflow pathway for moving ambient air through the open airflow pathway when activated.

10. The display assembly of claim 1 wherein:

the first direction opposes the second direction.

11. The display assembly of claim 1 wherein:

activation of said fan units is configured to cause:

some of said circulating gas exiting said airflow passageway of said first subassembly at a given instance to be directed towards the entrance to the airflow passageway of said second subassembly for crossover into the second subassembly;

other of said circulating gas exiting the airflow passageway of said first subassembly at the given instance to be directed towards the entrance to the airflow passageway of said first subassembly for recirculation through the first subassembly;

some of said circulating gas exiting the airflow passageway of said second subassembly at the given instance to be directed towards the entrance to said airflow passageway of said first subassembly for crossover into the second subassembly; and other of said circulating gas exiting the airflow passageway of the second subassembly at the given instance to be directed towards the entrance to the airflow passageway of said second subassembly for recirculation through the second subassembly.

12. The display assembly of claim 1 wherein:

each of the at least one fan of the fan units comprises a plurality of centrifugal type fans spaced apart from one another; and an intake for each of said plurality of centrifugal type fans is fluidly adjacent to said rear passageway.

13. A method for moving air within the display assembly of claim 1, said method comprising:

activating the first and second fan units.

14. A display assembly comprising:

a structural framework;

subassemblies, attached to a different sides of the structural framework and each comprising an electronic display and an airflow passageway such that an entrance to the airflow passageway of a first given one the subassemblies is located closer to an exit to the airflow passageway of a second given one of the subassemblies than the entrance to the airflow passageway of the second given one of the subassemblies;

a common airflow passageway providing an open, unobstructed, continuous, uncompartmentalized space between and along a rear surface of the subassemblies so as to provide a fluid connection among the airflow passageways of the subassemblies, thereby forming, at least in part, a closed airflow pathway for circulating gas for the subassemblies; and fan units, spaced apart from one another, facing in different directions within the common airflow passageway, and associated with different ones of the subassemblies, each fan unit comprising a ducted passageway encompassing, extending from, and providing an exclusive exit for the fan unit to the airflow passageway of the associated one of the subassemblies to the exclusion of non-associated one or ones of the subassemblies such that airflow of the circulating gas through the airflow passageways of the subassemblies travel in different directions when the fan units are operated.

15. The display assembly of claim 14 wherein:

the fan units, when activated, cause flows of the circulating gas from the common airflow passageway to be ingested, travel through the exits and ducted passageways thereof to the airflow pathway of the associated one of the subassemblies, and within the airflow passageway of the associated one of the subassemblies.

16. The display assembly of claim 15 wherein:

the fan units, when activated, generate turbulent flows within the common airflow passageway, including by when activated, causing a portion of each of the flows exiting the airflow passageways of the subassemblies to be reingested by the respective one of the fan units for recirculation within the respective one of the subassemblies and another portion of the flows exiting the airflow passageways of the subassemblies to cross the common airflow passageway for ingestion by a different one of the fan units for circulation within a different one of the subassemblies.

17. The display assembly of claim 16 wherein:

each of the fan units comprise multiple, centrifugal type fans; and the electronic display of each of the subassemblies comprise:

an electronic display layer;

an illumination device for providing illumination to said electronic display layer when activated; and a cover positioned forward of said electronic display layer;

wherein the airflow passageway extends, at least in part, between a rear surface of the cover and a forward surface of the electronic display layer.

18. The display assembly of claim 17 further comprising:

an intake fluidly connected to an ambient environment;

an exhaust fluidly connected to the ambient environment;

an additional airflow passageway provided at each of the first and second subassemblies and fluidly connected to the intake and the exhaust, said additional airflow passageway extending, at least in part, along a rear surface of the illumination device;

an open airflow pathway comprising the intake, the exhaust, and the additional airflow passageway of each of the first and second subassemblies; and one or more fans located along the open airflow pathway for moving ambient air through the open airflow pathway when activated.

19. A method for moving air within the display assembly of claim 14, said method comprising:

activating the fan units.

20. A display assembly comprising:

a structural framework;

subassemblies, each attached to a different side of the structural framework and comprising a cover layer which is transparent or translucent, a liquid crystal layer located rearward of the cover, a backlight for direct backlighting of the liquid crystal layer located rearward of the liquid crystal layer, and an airflow passageway extending, at least in part, in a space between the cover layer and the liquid crystal layer wherein an entrance to the airflow passageway of a first one the subassemblies is located closer to an exit to the airflow passageway of a second one of the subassemblies than the entrance to the airflow passageway of the second one of the subassemblies;

a common airflow passageway providing an open, unobstructed, continuous, uncompartmentalized space between and along a rear surface of each of the subassemblies so as to provide a fluid connection among the airflow passageways of each of the subassemblies, thereby forming a closed airflow pathway; and fan units, spaced apart from one another, facing in different directions within the common airflow passageway, and associated with different ones of the subassemblies, each fan unit comprising multiple, centrifugal type fans, and a common ducted passageway encompassing, extending from, and providing an exclusive exit for the fan unit to the airflow passageway of the associated one of the subassemblies to the exclusion of non-associated one or ones of the subassemblies such that airflow through the airflow passageways travels in different directions when the fan units are activated.

* * * * *